United States Patent
Hong et al.

(10) Patent No.: US 10,541,011 B1
(45) Date of Patent: Jan. 21, 2020

(54) ELECTRONIC DEVICE

(71) Applicant: SK hynix Inc., Icheon (KR)

(72) Inventors: Seok-Man Hong, Seoul (KR); Tae-Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/049,644

(22) Filed: Jul. 30, 2018

Related U.S. Application Data

(60) Provisional application No. 62/540,004, filed on Aug. 1, 2017.

(51) Int. Cl.
| | | |
|---|---|---|
| *G11C 11/00* | (2006.01) | |
| *G11C 7/12* | (2006.01) | |
| *G11C 13/00* | (2006.01) | |

(52) U.S. Cl.
CPC ............ *G11C 7/12* (2013.01); *G11C 13/0004* (2013.01); *G11C 13/0007* (2013.01); *G11C 13/0069* (2013.01)

(58) Field of Classification Search
CPC ... G11C 7/12; G11C 13/0004; G11C 13/0007; G11C 13/0069
See application file for complete search history.

(56) References Cited

U.S. PATENT DOCUMENTS

| | | | | | |
|---|---|---|---|---|---|
| 4,879,686 | A | * | 11/1989 | Suzuki | G11C 7/20 365/189.11 |
| 8,830,724 | B2 | * | 9/2014 | Chang | G11C 13/0033 365/148 |
| 9,472,276 | B1 | * | 10/2016 | Song | G11C 13/004 |
| 2017/0206961 | A1 | * | 7/2017 | Yoon | G06F 3/061 |

FOREIGN PATENT DOCUMENTS

| | | |
|---|---|---|
| KR | 10-2014-0028612 A | 3/2014 |
| KR | 10-2015-0099092 A | 8/2015 |

\* cited by examiner

*Primary Examiner* — Pho M Luu

(57) ABSTRACT

An electronic device includes a semiconductor memory. The semiconductor memory includes a memory cell; a first line coupled to a first end of the memory cell; a first coupling circuit to selectively couple a high voltage terminal to the first line in response to a first selection signal; a second line coupled to a second end of the memory cell; a second coupling circuit to selectively couple a first low voltage terminal to the second line in response to a second selection signal; and a first charge storing circuit selectively coupled to the first line in response to an enable signal, the enable signal corresponding to a predetermined operation mode when the memory cell is turned on.

20 Claims, 7 Drawing Sheets

ELECTRONIC DEVICE

CROSS-REFERENCE TO RELATED APPLICATIONS

The present application claims priority to U.S. Provisional Patent Application No. 62/540,004, entitled "ELECTRONIC DEVICE AND METHOD FOR DRIVING THE SAME" and filed on Aug. 1, 2017, which is incorporated by reference herein in its entirety.

TECHNICAL FIELD

This patent document relates to memory circuits, memory devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on, have been demanded. Such semiconductor devices include semiconductor devices that have a variable resistance characteristic, i.e., semiconductor devices that can store data by switching between different resistance states according to an applied voltage or current. Such semiconductor devices include, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits and memory devices, as well as their applications in electronic devices and systems. The disclosed technology also includes various implementations of an electronic device and a method for driving the same. The electronic device may include a semiconductor memory that can use an overshoot current in a predetermined operation, the overshoot current occurring unintentionally when a selected memory cell is turned on.

In an implementation, there is provided an electronic device including a semiconductor memory. The semiconductor memory may include: a memory cell; a first line coupled to a first end of the memory cell; a first coupling circuit to selectively couple a high voltage terminal to the first line in response to a first selection signal; a second line coupled to a second end of the memory cell; a second coupling circuit to selectively couple a first low voltage terminal to the second line in response to a second selection signal; and a first charge storing circuit selectively coupled to the first line in response to an enable signal, the enable signal corresponding to a predetermined operation mode when the memory cell is turned on.

the first charge storing circuit may adjust at least one of an amplitude and a pulse width of an overshoot current flowing through the first line when the memory cell is turned on. The first charge storing circuit may include: a first coupling unit to selectively couple the first line to a first node in response to the enable signal; and a first storing unit coupled between the first node and a second low voltage terminal. The first low voltage terminal and the second low voltage terminal may include a same voltage terminal or different voltage terminals. The semiconductor memory may further include: a second charge storing circuit selectively coupled to the second line in response to the enable signal when the memory cell is turned on. The second charge storing circuit may adjust at least one of an amplitude and a pulse width of an overshoot current flowing through the second line when the memory cell is turned on. The second charge storing circuit may include: a second coupling unit to selectively couple the second line to a second node in response to the enable signal; and a second storing unit coupled between the second node and a second low voltage terminal. The memory cell may include a variable resistance element and a selection element that are coupled in series to each other, a resistance state of the variable resistance element varying based on a current flowing through the memory cell, the selection element being turned on based on a voltage difference between the first and second ends of the memory cell. The predetermined operation mode may include a write mode, a resistance state of the memory cell changing to a high voltage state in the write mode. The predetermined operation mode may include a recovery mode, a threshold voltage of the memory cell returning to an original value in the recovery mode.

In an implementation, there is provided an electronic device including a semiconductor memory. The semiconductor memory may include: a global bit line; a plurality of local bit lines; a global word line; a plurality of local word lines; a write circuit coupled between a high voltage terminal and an output terminal, the write circuit being outputting an operation current corresponding to any one of a plurality of operation modes to the output terminal based on a plurality of enable signals, the plurality of enable signals corresponding to the plurality of operation modes; a first global coupling circuit to selectively couple the output terminal to the global bit line in response to a first global selection signal; a first local coupling circuit to selectively couple one bit line selected from the local bit lines to the global bit line based on a plurality of first local selection signals; a plurality of memory cells disposed in respective intersection regions between the local bit lines and the local word lines and coupled between the local bit lines and the local word lines, each of the memory cells having a resistance state corresponding to the operation current; a second local coupling circuit to selectively couple one word line selected from the local word lines to the global word line based on a plurality of second local selection signals; a second global coupling circuit to selectively couple the global word line to a low voltage terminal in response to a second global selection signal; a control circuit to generate a control enable signal based on two or more enable signals selected from the plurality of enable signals; and a first charge storing circuit selectively coupled to the global bit line in response to the control enable signal when a memory cell selected from the memory cells is turned on.

The first charge storing circuit may adjust at least one of an amplitude and a pulse width of an overshoot current flowing through the global bit line when the selected memory cell is turned on. The low voltage terminal may be a first low voltage terminal, and the first charge storing circuit may include: a first coupling unit to selectively couple the global bit line to a first node in response to the control enable signal; and a first storing unit coupled between the first node and a second low voltage terminal. The first low voltage terminal and the second low voltage terminal may include a same voltage terminal or different voltage terminals. The semiconductor memory may further include: a second charge storing circuit selectively coupled to the global word line in response to the control enable signal when the selected memory cell is turned on. The second charge storing circuit may adjust at least one of an amplitude and a pulse width of an overshoot current flowing through the global word line when the selected memory cell is turned on. The low voltage terminal may be a first low voltage terminal, and wherein the second charge storing circuit may include: a second coupling unit to selectively couple the global word line to a second node in response to the control enable signal; and a second storing unit coupled between the second node and a second low voltage terminal. Each of the memory cells may include a variable resistance element and a selection element that are coupled in series to each other, a resistance state of the variable resistance element varying based on the operation current, the selection element being turned on based on a voltage difference between both ends of each of the memory cells. The plurality of operation modes may include a write mode, a resistance state of the selected memory cell being changed to a high resistance state in the write mode. The plurality of operation modes may include a recovery mode, a threshold voltage of the selected memory cell returning to an original value in the recovery mode.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

DETAILED DESCRIPTION

Figure 1:
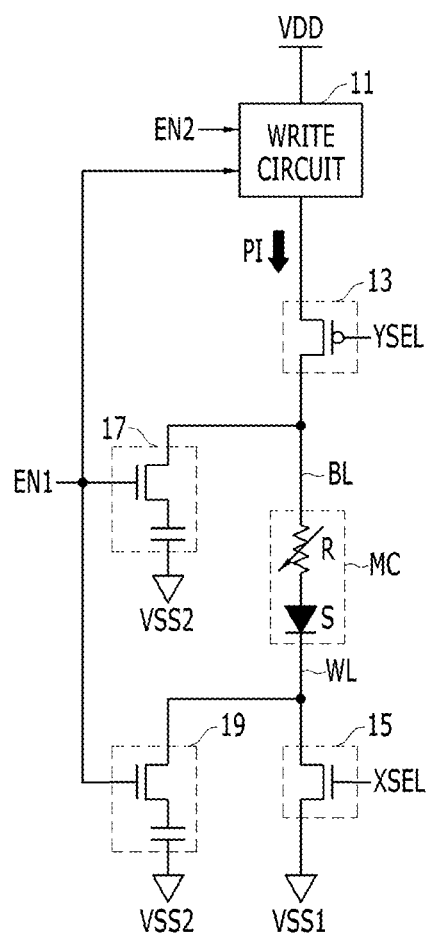
FIG. 1 is a circuit diagram illustrating a memory device in accordance with an implementation of the present disclosure.

Various examples and implementations of the disclosed technology are described below in detail with reference to the accompanying drawings.

The present disclosure may, however, be embodied in different forms and should not be construed as limited to the implementations set forth herein. Rather, these implementations are provided so that this disclosure will be thorough and complete, and will fully convey the scope of various embodiments of the present disclosure to those skilled in the art. Throughout the disclosure, like reference numerals refer to like parts throughout the various figures and implementations of the present disclosure.

A semiconductor memory device in accordance with implementations of the disclosed technology may include a variable resistance element that exhibits a variable resistance characteristic, i.e., a variable resistance element that represents different digital bits or states by exhibiting different resistance values. In implementations, such a variable resistance element may include a single-layer or a multi-layer structure exhibiting the variable resistance characteristic, and may include any of a material used in a RRAM, PRAM, STTRAM, MRAM, or FRAM (e.g., a ferromagnetic material); a ferroelectric material; a phase change material, such as a chalcogenide material; a metal oxide, such as a perovskite material; and a transition metal oxide.

The variable resistance element may include a metal oxide, a perovskite material, or both. The metal oxide may include a transition metal oxide, such as a nickel (Ni) oxide, a titanium oxide (TiO), a hafnium oxide (HfO), a zirconium oxide (ZrO), a tungsten oxide (WO), or a cobalt oxide (CoO). The perovskite material may include a material such as a strontium titanium oxide (STO: SrTiO) or a praseodymium calcium manganese oxide (PCMO: PrCaMnO).

Moreover, the variable resistance element may include a phase change material. The phase change material may include a chalcogenide material, such as germanium-antimony-tellurium (GST: GeSbTe). The variable resistance element switches between different resistance states by changing its structure into a crystalline state or an amorphous state according to heat applied to the phase change material.

The variable resistance element may include two magnetic layers and a tunnel barrier layer interposed between the two magnetic layers. The magnetic layer may include any of nickel-iron-cobalt (NiFeCo), Cobalt-iron (CoFe), etc. The tunnel barrier layer may include aluminum oxide ($Al_2O_3$). The variable resistance element may switch between two different resistance states according to magnetization directions of the two magnetic layers. For example, the variable resistance element may be in a low resistance state when the magnetization directions of the two magnetic layers are parallel, and may be in a high resistance state when the magnetization directions of the two magnetic layers are anti-parallel.

FIG. 1 is a circuit diagram illustrating a memory device 10 in accordance with an implementation of the present disclosure.

Referring to FIG. 1, the memory device 10 may include a memory cell MC, a write circuit 11, a first line BL, a first coupling circuit 13, a second line WL, a second coupling circuit 15, a first charge storing circuit 17, and a second charge storing circuit 19.

The memory cell MC may be turned on due to a voltage difference between both ends of the memory cell MC, and a resistance state of the memory cell MC may vary along with a current flowing through the memory cell MC. The memory cell MC may include a variable resistance element R and a selection element S that are coupled in series between the first line BL and the second line WL.

For example, the variable resistance element R may include a phase-change material. The variable resistance element R may be in a high resistance state, which is an amorphous state, or in a low resistance state, which is a crystalline state. More specifically, when a first write current having a fast quenching pattern is applied to the variable resistance element R in a first write mode, the variable resistance element R may be melted and then rapidly cooled down. Consequently, the variable resistance element R has the high resistance state that is the amorphous state. On the other hand, when a second write current having a slow quenching pattern is applied to the variable resistance element R in a second write mode, the variable resistance element R may be melted and then gradually and slowly cooled down. Consequently, the variable resistance element R has the low resistance state that is the crystalline state.

For example, the selection element S may include an ovonic threshold switch (OTS) including a chalcogenide-based material. The selection element S may be turned on when the voltage difference between both ends of the memory cell MC, that is, a voltage difference between the first line BL and the second line WL, is higher than a threshold voltage of the selection element S. The selection element S may have drift characteristics in which the threshold voltage or a self-resistance component varies with time. The drift characteristics may be improved by performing a recovery mode. In the recovery mode, the threshold voltage or the self-resistance component of the selection element S may be restored to an original value by turning on the selection element S and then flowing a recovery current having an extremely low level into the selection element S. The extremely low level may represent a current level by which a resistance state of the variable resistance element R is not affected.

The write circuit 11 may be coupled between a high voltage terminal VDD and an output terminal. The write circuit 11 may generate an operation current PI corresponding to a first operation mode or a second operation mode, and output the operation current PI to the output terminal. The operation current PI corresponds to the first operation mode when the write circuit 11 receives a first enable signal EN1, and corresponds to the second operation mode when the write circuit 11 receives a second enable signal EN2.

For example, the first operation mode may include the first write mode or the recovery mode. In the first operation mode, the operation current PI may include the first write current or the recovery current. Particularly, the write circuit 11 according to an implementation of the present disclosure may generate the first write current having a level equal to or lower than a melting point Imelt of the variable resistance element R in the first write mode.

The second operation mode may include the second write mode. In the second operation mode, the operation current PI may include the second write current.

The first coupling circuit 13 may selectively couple the output terminal of the write circuit 11 to the first line BL in response to a first selection signal YSEL. For example, the first coupling circuit 13 may include a PMOS transistor. The PMOS transistor has a gate to which the first selection signal YSEL is inputted, and is coupled between the output terminal of the write circuit 11 and the first line BL. The first selection signal YSEL may be activated in the first and second operation modes.

The second coupling circuit 15 may selectively couple a first low voltage terminal VSS1 to the second line WL in response to a second selection signal XSEL. For example, the second coupling circuit 15 may include an NMOS transistor. The NMOS transistor has a gate to which the second selection signal XSEL is inputted, and is coupled between the first low voltage terminal VSS1 and the second line WL. The second selection signal XSEL may be activated in the first and second operation modes.

The first charge storing circuit 17 may be coupled between the first line BL and a second low voltage terminal VSS2. The first charge storing circuit 17 may be selectively coupled to the first line BL in response to the first enable signal EN1 when the memory cell MC is turned on. In the first operation mode, the first charge storing circuit 17 coupled to the first line BL may adjust an overshoot current flowing through the first line BL when the memory cell MC is turned on. For example, the first charge storing circuit 17 may increase a size (i.e., an amplitude) of the overshoot current, and increase a pulse width of the overshoot current, that is, increase a decay time of the overshoot current. The size and decay time of the overshoot current may be determined by a capacitance of the first charge storing circuit 17. The overshoot current may be generated due to a rapid decrease in resistance, that is, a snapback phenomenon, when the selection element S of the memory cell MC is turned on, and the overshoot current may be combined with the operation current PI generated in the first operation mode.

For example, in the first write mode, the overshoot current may be combined with the operation current PI corresponding to the first write current. The combined current may have a level equal to or higher than the melting point Imelt of the variable resistance element R.

For example, in the recovery mode, the overshoot current may be combined with the operation current PI corresponding to the recovery current. As described above, since the recovery current may have the extremely low level, the recovery current may deteriorate due to line loading, and thus a recovery operation may not be normally performed. However, such a deterioration may be prevented by combining the recovery current with the overshoot current.

The first charge storing circuit 17 may include a first coupling unit, and a first storing unit. The first coupling unit may selectively couple the first line BL to a first node in response to the first enable signal EN1. For example, the first coupling unit may include an NMOS transistor. The NMOS transistor has a gate to which the first enable signal EN1 is inputted, and is coupled between the first node and the first line BL. A charge corresponding to the overshoot current may be stored in the first storing unit. For example, the first storing unit may include a capacitor coupled between the first node and the second low voltage terminal VSS2.

The second charge storing circuit 19 may be coupled between the second line WL and the second low voltage terminal VSS2. The second charge storing circuit 19 may be selectively coupled to the second line WL in response to the first enable signal EN1 when the memory cell MC is turned on. In the first operation mode, the second charge storing circuit 19 coupled to the second line WL may adjust the overshoot current flowing through the second line WL when the memory cell MC is turned on. For example, the second charge storing circuit 19 together with the first charge storing circuit 17 may increase the size and decay time of the overshoot current. The size and decay time of the overshoot current may be determined by capacitances of the first and second charge storing circuits 17 and 19.

The second charge storing circuit 19 may include a second coupling unit and a second storing unit. The second coupling unit may selectively couple the second line WL to a second node in response to the first enable signal EN1. For example, the second coupling unit may include an NMOS transistor. The NMOS transistor has a gate to which the first enable signal EN1 is inputted, and is coupled between the second node and the second line WL. A charge corresponding to the overshoot current may be stored in the second storing unit. For example, the second storing unit may include a capacitor coupled between the second node and the second low voltage terminal VSS2. The second low voltage terminal VSS2 may be the same as or different from the first low voltage terminal VSS1.

Hereinafter, an operation of the memory device 10 having the afore-mentioned structure shown in FIG. 1 will be described.

First of all, a case where the first operation mode is initiated will be described.

In the first operation mode, the first enable signal EN1 is activated and the second enable signal EN2 is deactivated. As the first enable signal EN1 is activated, the write circuit 11 may couple the high voltage terminal VDD to the output terminal, the first charge storing circuit 17 may be coupled to the first line BL, and the second charge storing circuit 19 may be coupled to the second line WL. As the first selection signal YSEL and the second selection signal XSEL are activated, the first line BL may be coupled to the output terminal of the write circuit 11 through the first coupling circuit 13, and the second line WL may be coupled to the first low voltage terminal VSS1 through the second coupling circuit 15. The first enable signal EN1, the first selection signal YSEL, and the second selection signal XSEL may be simultaneously or sequentially activated in the first operation mode.

When the voltage difference between both ends of the memory cell MC is higher than the threshold voltage of the selection element S, the selection element S is turned on. As the selection element S is turned on, the write circuit 11 may generate the operation current PI corresponding to the first operation mode. For example, when the first operation mode is the first write mode, the write circuit 11 may generate the operation current PI having a level that is equal to or lower than the melting point Imelt of the variable resistance element R.

When the selection element S is turned on, the overshoot current may be generated due to the snapback phenomenon. The pulse width of the overshoot current may be adjusted by the capacitances of the first and second charge storing circuits 17 and 19. For example, the decay time of the overshoot current may increase by charges stored in the capacitors of the first and second charge storing circuits 17 and 19. The overshoot current may be combined with the operation current PI, and the combined current may be applied to the memory cell MC.

Figure 2:
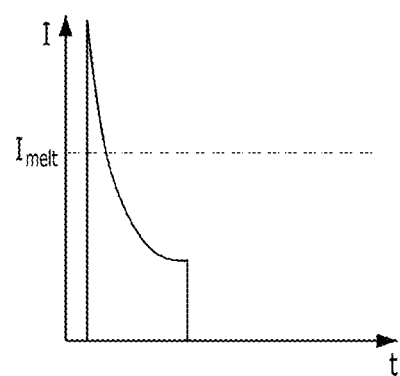
FIG. 2 is a graph showing a current flowing through a memory cell shown in FIG. 1.

FIG. 2 is a graph showing a current that is applied to the memory cell MC of FIG. 1 in the first write mode. The current applied to the memory cell MC is the combined current of the operation current PI and the overshoot current.

Referring to FIG. 2, although the operation current PI generated from the write circuit 11 has the level that is equal to or lower than the melting point Imelt of the variable resistance element R, the operation current PI and the overshoot current may be combined with each other, and thus the combined current of the operation current PI and the overshoot current, which has a level that is equal to or higher than the melting point Imelt, may be applied to the memory cell MC. The size and decay time of the overshoot current may increase by the capacitances of the first and second charge storing circuits 17 and 19, whereby a condition in which the resistance state of the memory cell MC is changed to the high voltage state may be satisfied. Accordingly, the memory cell MC may be programmed to the high resistance state, which is the amorphous state, when the memory cell MC is being rapidly cooled down after being melted due to the combined current having the fast quenching pattern.

Although not illustrated, the overshoot current may also be combined with the operation current PI generated from the write circuit 11 in the recovery mode. In the recovery mode, the operation current PI may correspond to the recovery current. As described above, the recovery current may have the extremely low level. For this reason, the recovery current may deteriorate by line loading, and thus the recovery operation may not be normally performed.

However, the deterioration of the recovery current may be prevented by the overshoot current that is combined with the recovery current. The size and decay time of the overshoot current may increase based on the capacitances of the capacitors in the first and second charge storing circuits 17 and 19, such that a condition in which the memory cell MC is recovered may be satisfied. That is, in the recovery mode, the threshold voltage of the selection element S is recovered to the original value by performing the recovery mode with the combined current.

Next, a case where the second operation mode is initiated will be described.

In the second operation mode, the second enable signal EN2 is activated and the first enable signal EN1 is deactivated. As the second enable signal EN2 is activated, the write circuit 11 may couple the high voltage terminal VDD to the output terminal. As the first enable signal EN1 is deactivated, the first charge storing circuit 17 may not be coupled to the first line BL, and the second charge storing circuit 19 may not be coupled to the second line WL. At this time, when the first selection signal YSEL and the second selection signal XSEL are activated, the first line BL may be coupled to the output terminal of the write circuit 11, and the second line WL may be coupled to the first low voltage terminal VSS1. The second enable signal EN2, the first selection signal YSEL, and the second selection signal XSEL may be activated simultaneously or sequentially in a predetermined order in the second operation mode.

When the voltage difference between both ends of the memory cell MC is higher than the threshold voltage of the selection element S, the selection element S is turned on. As the selection element S is turned on, the write circuit 11 may generate the operation current PI corresponding to the second operation mode. For example, the write circuit 11 may generate the second write current having the slow quenching pattern as the operation current PI. Accordingly, the memory cell MC may be programmed to the low resistance state, which is the crystalline state, as the memory cell MC is being gradually cooled down after being melted by the second write current.

When the selection element S is turned on in the second operation mode, the overshoot current may be generated due to the snapback phenomenon. However, since the first charge storing circuit 17 is not coupled to the first line BL and the second charge storing circuit 19 is not coupled to the second line WL, an influence of the overshoot current may be minimized in the second operation mode.

Figure 3:
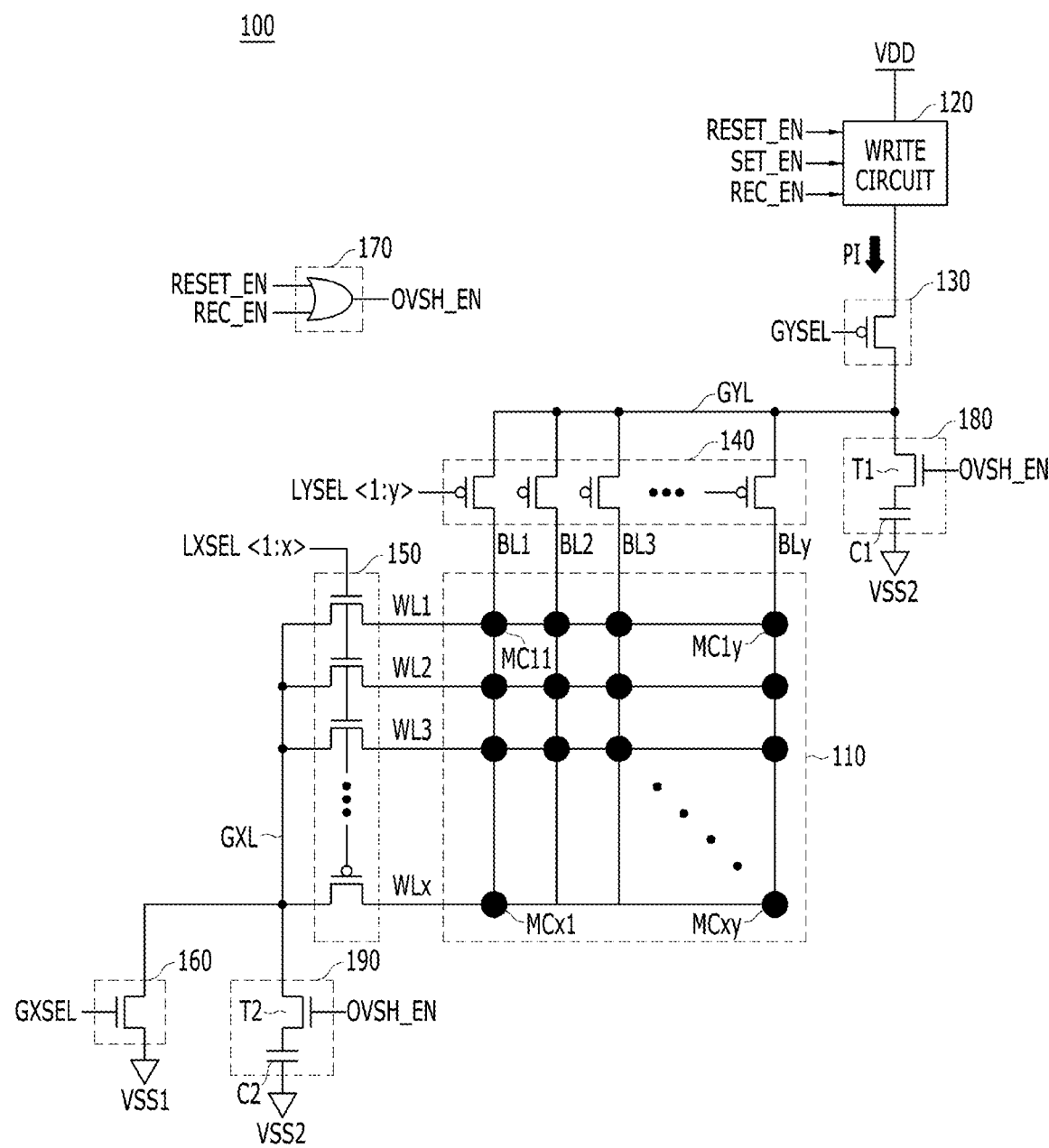
FIG. 3 is a circuit diagram illustrating a memory device in accordance with an implementation of the present disclosure.

FIG. 3 is a circuit diagram illustrating a memory device 100 in accordance with an implementation of the present disclosure.

Referring to FIG. 3, the memory device 100 may include a memory cell array 110, a write circuit 120, a global bit line coupling circuit 130, a plurality of local bit line coupling circuits 140, a plurality of local word line coupling circuits 150, a global word line coupling circuit 160, a control circuit 170, a first charge storing circuit 180, and a second charge storing circuit 190.

The memory cell array 110 may have a cross-point array structure. In the cross-point array structure, a plurality of memory cells MC11 to MCxy may be disposed in respective intersection regions between a plurality of local bit lines BL1 to BLy and a plurality of local word lines WL1 to WLx, and may be coupled to the plurality of local bit lines BL1 to BLy and the plurality of local word lines WL1 to WLx, x and y being positive integers. Each of the local bit lines BL1 to BLy may extend in parallel in a column direction, and each of the local word lines WL1 to WLx may extend in parallel in a row direction crossing the column direction.

Each of the memory cells MC11 to MCxy may be turned on by a voltage difference between both ends thereof, and a resistance state of each of the memory cells MC11 to MCxy may vary with a current flowing through each of the memory cells MC11 to MCxy. Hereinafter, the current flowing through a memory cell MC is referred to as a "cell current."

The memory cells MC11 to MCxy may have the same structure. For example, each of the memory cells MC11 to MCxy may include a variable resistance element and a selection element, as illustrated in FIG. 1.

A variable resistance element may include a phase-change material. When it is programmed, the variable resistance element may have a high resistance state, which is an amorphous state, or a low resistance state, which is a crystalline state. More specifically, in a first write mode, the variable resistance element may be melted by a first write current having a fast quenching pattern, and then rapidly cooled down. Consequently, the variable resistance element may be programmed to the high resistance state, i.e., the amorphous state. On the other hand, in a second write mode, the variable resistance element may be melted by a second write current having a slow quenching pattern, and then gradually cooled down. Consequently, the variable resistance element may be programmed to the low resistance state, i.e., the crystalline state.

A selection element may include an ovonic threshold switch (OTS) including a chalcogenide-based material. The selection element may be turned on when a voltage difference between both ends of a corresponding memory cell MC is higher than a threshold voltage of the selection element. For example, in the first memory cell MC11, a selection element may be turned on when a voltage difference between the first local bit line BL1 and the first local word line WL1 is higher than a threshold voltage of the selection element. The selection element may have drift characteristics in which the threshold voltage or a self-resistance component varies with time. The drift characteristics may be improved by performing a recovery mode. In the recovery mode, the threshold voltage or the self-resistance component of the selection element may be restored to an original value by turning on the selection element and then flowing a recovery current having an extremely low level into the selection element. The extremely low level of the recovery current may correspond to a level by which a resistance state of the variable resistance element is not affected.

The write circuit 120 may be coupled between a high voltage terminal VDD and an output terminal. The write circuit 120 may generate an operation current PI corresponding to any one of first to third operation modes to the output terminal based on first to third enable signals RESET_EN, SET_EN, and REC_EN, correspond to the first to third operation modes, respectively.

The first operation mode may include the first write mode. In the first operation mode, the operation current PI may include the first write current. The write circuit 120 may generate the first write current having a level equal to or lower than a melting point Imelt of the variable resistance element in the first write mode.

The second operation mode may include the second write mode. In the second operation mode, the operation current PI may include the second write current.

The third operation mode may include the recovery mode. In the third operation mode, the operation current PI may include the recovery current.

The global bit line coupling circuit 130 may selectively couple the output terminal of the write circuit 120 to a global bit line GYL in response to a global bit line selection signal GYSEL. For example, the global bit line coupling circuit 130 may include a PMOS transistor having a gate to which the global bit line selection signal GYSEL is inputted, and being coupled between the output terminal of the write circuit 120 and the global bit line GYL. The global bit line selection signal GYSEL may be activated in the first to third operation modes.

The local bit line coupling circuits 140 may selectively couple at least one of the local bit lines BL1 to BLy to the global bit line GYL based on a plurality of local bit line selection signals LYSEL<1:y>. Each of the local bit line coupling circuits 140 may include a PMOS transistor having a gate to which a corresponding local bit line selection signal LYSEL<#> among the local bit line selection signals LYSEL<1:y> is inputted, and being coupled between the global bit line GYL and a corresponding local bit line BL# among the local bit lines BL1 to BLy. Any one of the local bit line selection signals LYSEL<1:y> may be activated in the first to third operation modes.

The local word line coupling circuits 150 may selectively couple at least one of the local word lines WL1 to WLx to a global word line GXL based on a plurality of local word line selection signals LXSEL<1:x>. Each of the local word line coupling circuits 150 may include an NMOS transistor having a gate to which a corresponding local word line selection signal LXSEL<#> among the local word line selection signals LXSEL<1:x> is inputted, and being coupled between the global word line GXL and a corresponding local word line WL# among the local word lines WL1 to WLx. Any one of the local word line selection signals LXSEL<1:x> may be activated in the first to third operation modes.

The global word line coupling circuit 160 may selectively couple a first low voltage terminal VSS1 to the global word line GXL in response to a global word line selection signal GXSEL. For example, the global word line coupling circuit 160 may include an NMOS transistor having a gate to which the global word line selection signal GXSEL is inputted, and being coupled between the first low voltage terminal VSS1 and the global word line GXL. The global word line selection signal GXSEL may be activated in the first to third operation modes.

The control circuit 170 may generate a control enable signal OVSH_EN based on the first and third enable signals RESET_EN and REC_EN. For example, the control circuit 170 may include an OR gate for performing an OR operation on the first and third enable signals RESET_EN and REC_EN to output the control enable signal OVSH_EN. Therefore, when at least one of the first and third enable signals RESET_EN and REC_EN is activated, the control enable signal OVSH_EN is activated. When both of the first and third enable signals RESET_EN and REC_EN are deactivated, the control enable signal OVSH_EN is deactivated. Therefore, in the first and third operation modes, the control enable signal OVSH_EN is activated. On the other hand, in the second operation mode, the control enable signal OVSH_EN is deactivated.

The first charge storing circuit 180 may be coupled between the global bit line GYL and a second low voltage terminal VSS2. The first charge storing circuit 180 may be selectively coupled to the global bit line GYL in response to the control enable signal OVSH_EN when a memory cell MC# selected from the memory cells MC11 to MCxy is turned on. The first charge storing circuit 180 coupled to the global bit line GYL may adjust the overshoot current flowing through the global bit line GYL when the selected memory cell MC# is turned on. The first charge storing circuit 180 may increase a size (i.e., an amplitude) of the overshoot current, and increase a pulse width of the overshoot current, that is, a decay time of the overshoot current. For example, the size and decay time of the overshoot current may be determined by a capacitance of the first charge storing circuit 180.

The overshoot current may be generated by a rapid decrease in resistance, that is, a snapback phenomenon, which occurs when the selected memory cell MC# is turned on. The overshoot current may be combined with the operation current PI generated in the first operation mode or in the third operation mode. For example, the overshoot current may be combined with the operation current PI corresponding to the first write current in the first write mode. The combined current may have a level that is equal to or higher than the melting point Imelt of the variable resistance element. The overshoot current may be combined with the operation current PI corresponding to the recovery current in the recovery mode. As described above, the recovery current may have the extremely low level. For this reason, the recovery current may deteriorate by line loading, and thus a recovery operation may not be normally performed. However, the deterioration of the recovery current may be prevented by combining the recovery current with the overshoot current in the recovery mode.

The first charge storing circuit 180 may include a first coupling unit T1 and a first storing unit C1. The first coupling unit T1 may selectively couple the global bit line GYL to a first node in response to the control enable signal OVSH_EN. For example, the first coupling unit T1 may include an NMOS transistor having a gate to which the control enable signal OVSH_EN is inputted, and being coupled between the first node and the global bit line GYL. A charge corresponding to the overshoot current may be stored in the first storing unit C1. For example, the first storing unit C1 may include a capacitor coupled between the first node and the second low voltage terminal VSS2.

The second charge storing circuit 190 may be coupled between the global word line GXL and the second low voltage terminal VSS2. The second charge storing circuit 190 may be selectively coupled to the global word line GXL in response to the control enable signal OVSH_EN when the selected memory cell MC# is turned on. The second charge storing circuit 190 coupled to the global word line GXL may adjust the overshoot current flowing through the global word line GXL when the selected memory cell MC# is turned on. The first charge storing circuit 180 and the second charge storing circuit 190 together may increase the size and decay time of the overshoot current. For example, the size and decay time of the overshoot current may be determined by capacitances of the first and second charge storing circuits 180 and 190.

The second charge storing circuit 190 may include a second coupling unit T2 and a second storing unit C2. The second coupling unit T2 may selectively couple the global word line GXL to a second node in response to the control enable signal OVSH_EN. For example, the second coupling unit T2 may include an NMOS transistor having a gate to which the control enable signal OVSH_EN is inputted, and being coupled between the second node and the global word line GXL. A charge corresponding to the overshoot current may be stored in the second storing unit C2. For example, the second storing unit C2 may include a capacitor coupled between the second node and the second low voltage terminal VSS2. The second low voltage terminal VSS2 may be the same as, or different from, the first low voltage terminal VSS1.

Hereinafter, an operation of the memory device 100 having the afore-mentioned structure illustrated in FIG. 3 will be described.

First of all, a case where the first operation mode, that is, the first write mode, is initiated will be described.

The first enable signal RESET_EN, the global bit line selection signal GYSEL, the local bit line selection signal LYSEL<#> selected from the local bit line selection signals LYSEL<1:y>, the global word line selection signal GXSEL, and the local word line selection signal LXSEL<#> selected from the local word line selection signals LXSEL<1:x> may be activated simultaneously or sequentially in a predetermined order. At this time, the control enable signal OVSH_EN may also be activated as the first enable signal RESET_EN is activated.

The write circuit 120 may couple the high voltage terminal VDD to the output terminal based on the first enable signal RESET_EN that is activated. The first charge storing circuit 180 may be coupled to the global bit line GYL in response to the control enable signal OVSH_EN that is activated, and the second charge storing circuit 190 may be coupled to the global word line GXL in response to the control enable signal OVSH_EN that is activated. The global bit line coupling circuit 130 may couple the global bit line GYL to the output terminal of the write circuit 120 in response to the global bit line selection signal GYSEL that is activated. The global word line coupling circuit 160 may couple the global word line GXL to the first low voltage terminal VSS1 in response to the global word line selection signal GXSEL that is activated. The local bit line coupling circuits 140 may couple the global bit line GYL to the local bit line BL# selected from the local bit lines BL1 to BLy in response to the selected local bit line selection signal LYSEL<#>. The local word line coupling circuits 150 may couple the global word line GXL to the local word line WL# selected from the local word lines WL1 to WLx in response to the selected local word line selection signal LXSEL<#>. At this time, a memory cell coupled between the selected local bit line BL# and the selected local word line WL#, among the memory cells MC11 to MCxy, may be the selected memory cell MC#.

A voltage difference between both ends of the selected memory cell MC# may be higher than a threshold voltage of a selection element in the selected memory cell MC#, and consequently, the selection element may be turned on. As the selection element is turned on, the write circuit 120 may generate the operation current PI corresponding to the first operation mode. For example, in the first operation mode that is the first write mode, the write circuit 120 may generate, as the operation current PI, the first write current having a level that is equal to or lower than a melting point Imelt of a variable resistance element.

When the selection element is turned on, an overshoot current may be generated by a snapback phenomenon occurring when the selection element is turned on. A pulse width of the overshoot current may be adjusted by the first and second charge storing circuits 180 and 190. For example, a decay time of the overshoot current may increase. The overshoot current may be combined with the operation current PI and applied to the selected memory cell MC#. As described above with reference to FIG. 2, although the operation current PI generated from the write circuit 120 has a level that is equal to or lower than the melting point Imelt of the variable resistance element, since the operation current PI and the overshoot current may be combined with each other, the combined current of the operation current PI and the overshoot current, which may have a level that is equal to or higher than the melting point Imelt, may be applied to the selected memory cell MC#. The size and decay time of the overshoot current may be increased by the first and second charge storing circuits 180 and 190. Therefore, a condition in which a resistance state of the selected memory cell MC# is changed to a high voltage state may be satisfied by the overshoot current having the increased size and decay time. As a result, the selected memory cell MC# may be programmed to the high resistance state by the combined current having a fast quenching pattern.

Next, a case where the second operation mode, that is, the second write mode, is initiated will be described.

The second enable signal SET_EN, the global bit line selection signal GYSEL, the local bit line selection signal LYSEL<#> selected from the local bit line selection signals LYSEL<1:y>, the global word line selection signal GXSEL, and the local word line selection signal LXSEL<#> selected from the local word line selection signals LXSEL<1:x> may be activated simultaneously or sequentially in a predetermined order. In the second operation mode, since the first and third enable signals RESET_EN and REC_EN are deactivated while the second enable signal SET_EN is activated, the control enable signal OVSH_EN may be in a deactivated state.

The write circuit 120 may couple the high voltage terminal VDD to the output terminal based on the second enable signal SET_EN that is activated. The first charge storing circuit 180 may be disconnected from the global bit line GYL because the control enable signal OVSH_EN is deactivated, and the second charge storing circuit 190 may also not be coupled to the global word line GXL because the control enable signal OVSH_EN is deactivated. The global bit line coupling circuit 130 may couple the global bit line GYL to the output terminal of the write circuit 120 in response to the global bit line selection signal GYSEL that is activated. The global word line coupling circuit 160 may couple the global word line GXL to the first low voltage terminal VSS1 in response to the global word line selection signal GXSEL that is activated. The local bit line coupling circuits 140 may couple the global bit line GYL to the local bit line BL# selected from the local bit lines BL1 to BLy based on the selected local bit line selection signal LYSEL<#>. The local word line coupling circuit 150 may couple the global word line GXL to the local word line WL# selected from the local word lines WL1 to WLx based on the selected local word line selection signal LXSEL<#>. At this time, a memory cell coupled between the selected local bit line BL# and the selected local word line WL#, among the memory cells MC11 to MCxy, may be the selected memory cell MC#.

The voltage difference between both ends of the selected memory cell MC# may be higher than the threshold voltage of the selection element, and consequently, the selection element may be turned on. As the selection element is turned on, the write circuit 120 may generate the operation current PI corresponding to the second operation mode. For example, in the second operation mode that is the second write mode, the write circuit 120 may generate, as the operation current PI, the second write current having a slow quenching pattern. Accordingly, the selected memory cell MC# may be programmed to the low resistance state by the second write current having the slow quenching pattern.

When the selection element is turned on in the second operation mode, the overshoot current may be generated due to the snapback phenomenon. However, in the second operation mode, since the first charge storing circuit 180 is not coupled to the global bit line GYL and the second charge storing circuit 190 is not coupled to the global word line GXL, an influence of the overshoot current may be minimized since the size and decay time of the overshoot current do not increase.

Finally, a case where the third operation mode, that is, the recovery mode, is initiated will be described.

The third enable signal REC_EN, the global bit line selection signal GYSEL, the local bit line selection signal LYSEL<#> selected from the local bit line selection signals LYSEL<1:y>, the global word line selection signal GXSEL, and the local word line selection signal LXSEL<#> selected from the local word line selection signals LXSEL<1:x> may be activated simultaneously or sequentially in a predetermined order. At this time, the control enable signal OVSH_EN may be activated based on the third enable signal REC_EN that is activated.

The write circuit 120 may couple the high voltage terminal VDD to the output terminal based on the third enable signal REC_EN that is activated. The first charge storing circuit 180 may be coupled to the global bit line GYL in response to the control enable signal OVSH_EN that is activated, and the second charge storing circuit 190 may be coupled to the global word line GXL in response to the control enable signal OVSH_EN that is activated. The global bit line coupling circuit 130 may couple the global bit line GYL to the output terminal of the write circuit 120 in response to the global bit line selection signal GYSEL that is activated. The global word line coupling circuit 160 may couple the global word line GXL to the first low voltage terminal VSS1 in response to the global word line selection signal GXSEL that is activated. The local bit line coupling circuits 140 may couple the global bit line GYL to the local bit line BL# selected from the local bit lines BL1 to BLy based on the selected local bit line selection signal LYSEL<#>. The local word line coupling circuits 150 may couple the global word line GXL to the local word line WL# selected from the local word lines WL1 to WLx based on the selected local word line selection signal LXSEL<#>. At this time, a memory cell coupled between the selected local bit line BL# and the selected local word line WL#, among the memory cells MC11 to MCxy, may be the selected memory cell MC#.

The voltage difference between both ends of the selected memory cell MC# may be higher than the threshold voltage of the selection element, and consequently, the selection element may be turned on. As the selection element is turned on, the write circuit 120 may generate the operation current PI corresponding to the third operation mode. For example, in the recovery mode, the write circuit 120 may generate, as the operation current PI, the recovery current having the extremely low level.

When the selection element is turned on, the overshoot current may be generated due to the snapback phenomenon. The pulse width of the overshoot current may be adjusted by the first and second charge storing circuits 180 and 190. For example, the decay time of the overshoot current may increase. The overshoot current may be combined with the recovery current to be applied to the selected memory cell MC#. Since the recovery current has the extremely low level, the recovery operation may not be normally performed when the recovery current deteriorates due to line loading. When the recovery current is applied to a memory cell among the memory cells MC11 to MCxy that is disposed relatively far from the write circuit 120, the recovery current may be significantly lower than a recovery current applied to a closer one of the memory cells MC11 to MCxy, due to greater line loading because of the location of the memory cell. However, the deterioration of the recovery current may be prevented by combining the overshoot current with the recovery current. At this time, since the size and decay time of the overshoot current may increase by the first and second charge storing circuits 180 and 190, a recovering condition of the selected memory cell MC#, in which a threshold voltage or a self-resistance component of the selection element is restored to the original value, is satisfied by the combined current.

As is apparent from the above descriptions, in the memory device and the method for driving the same in accordance with the implementations, an overshoot current may be selectively used depending on operation modes, and thus operational characteristics of the memory device may be improved.

In addition, in the memory device and the method for driving the same in accordance with the implementations, an overshoot current occurring unintentionally when a selected memory cell is turned on may be increased using a charge storing circuit and used in a predetermined operation. Accordingly, a current consumed in the predetermined operation may be reduced by using a combined current of an operation current and the overshoot current, whose size and decay time are increased using the charge storing circuit. The overshoot current increases a current applied to the selected memory cell.

Also, since the overshoot current may be used just for the predetermined operation, an influence of the overshoot current may be minimized during an operation that is different from the predetermined operation.

The above and other memory circuits or semiconductor devices based on the disclosed technology may be used in a range of devices or systems. FIGS. 4-8 provide some examples of devices or systems that may implement the memory circuits disclosed herein.

Figure 4:
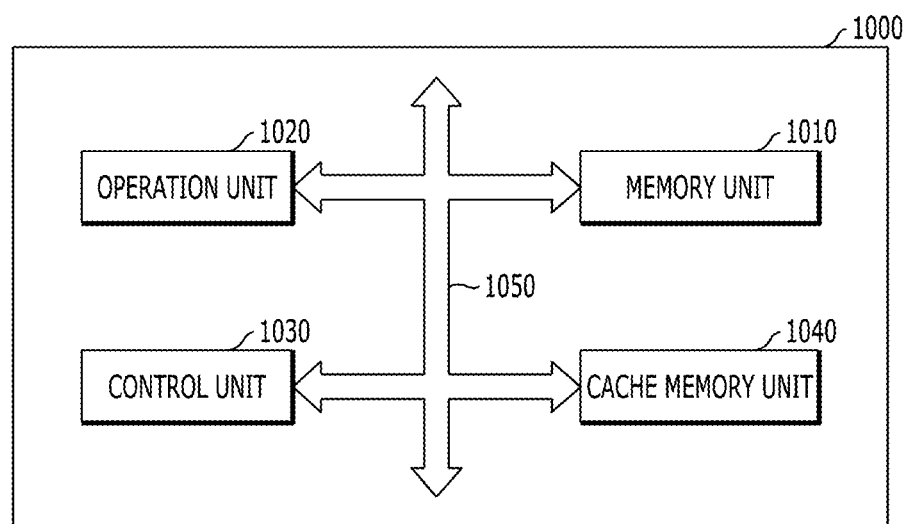
FIG. 4 is an example of a configuration diagram of a microprocessor implementing memory circuitry based on an implementation of the disclosed technology.

FIG. 4 is an example of a configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
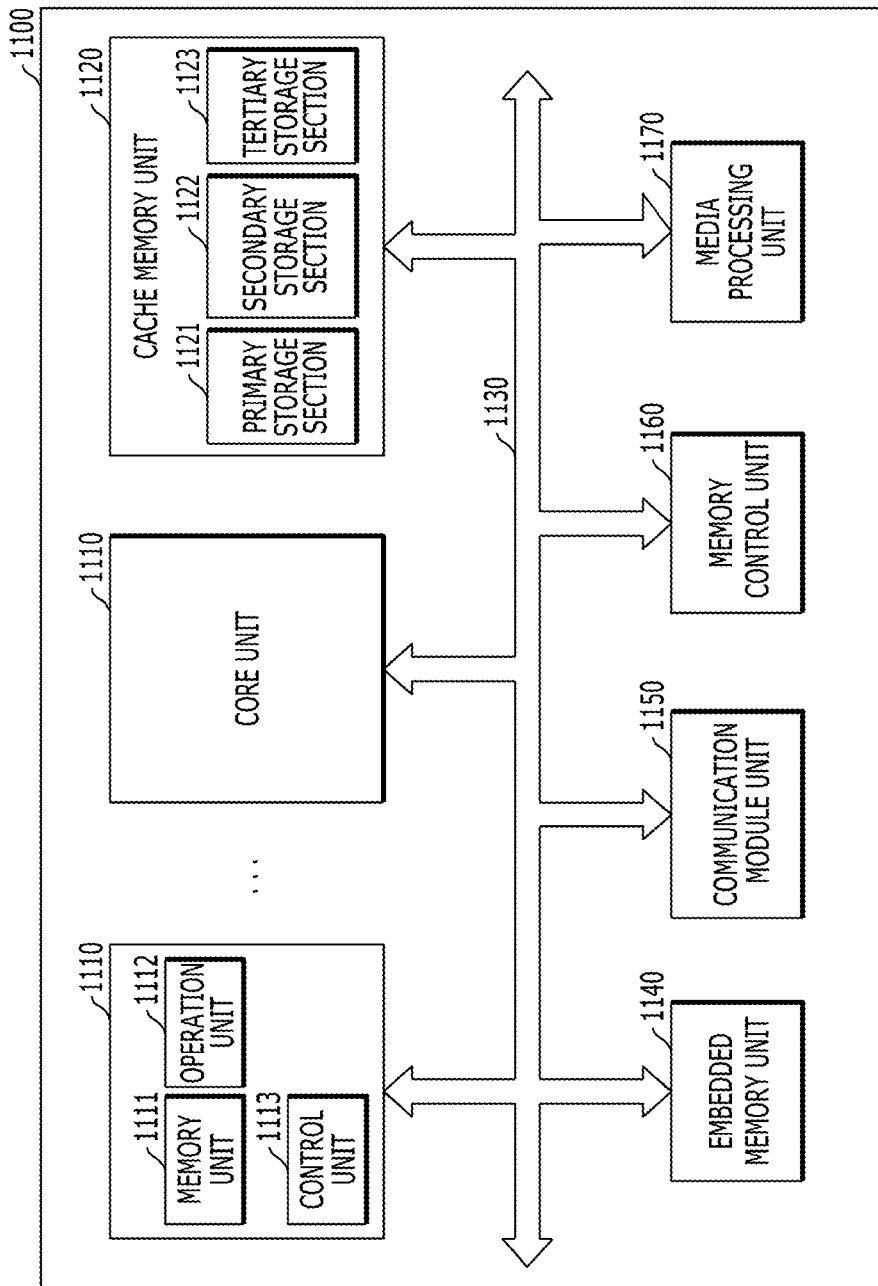
FIG. 5 is an example of a configuration diagram of a processor implementing memory circuitry based on an implementation of the disclosed technology.

FIG. 5 is an example of a configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the cache memory unit 1120 may be improved. As a consequence, performance characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit

1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
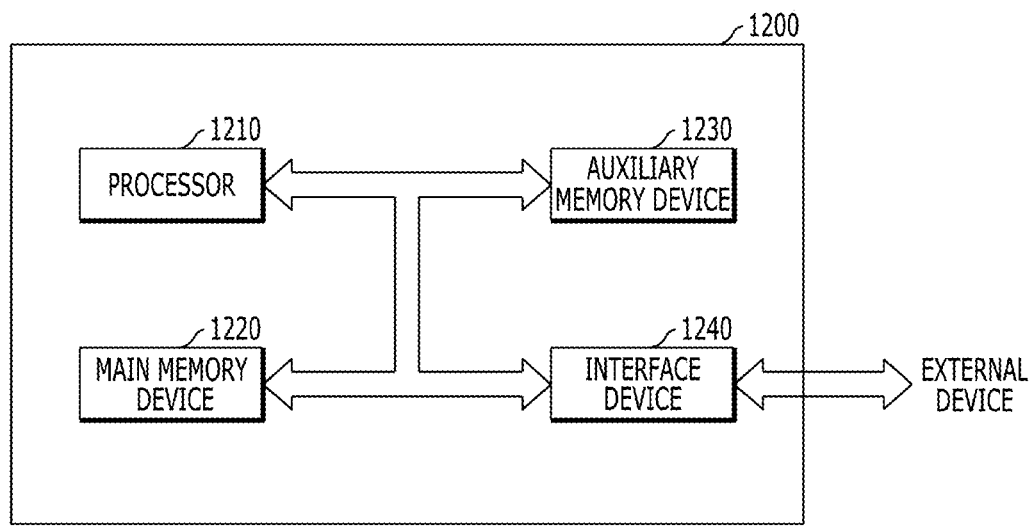
FIG. 6 is an example of a configuration diagram of a system implementing memory circuitry based on an implementation of the disclosed technology.

FIG. 6 is an example of a configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
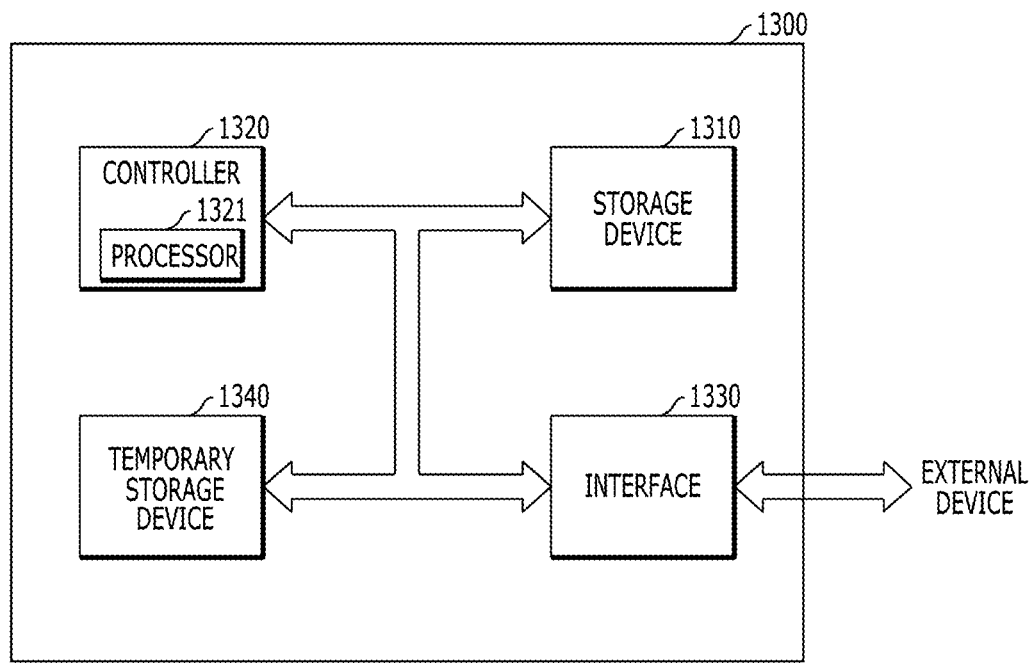
FIG. 7 is an example of a configuration diagram of a data storage system implementing memory circuitry based on an implementation of the disclosed technology.

FIG. 7 is an example of a configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the temporary storage device 1340 may be improved. As a consequence, performance characteristics of the system 1300 may be improved.

Figure 8:
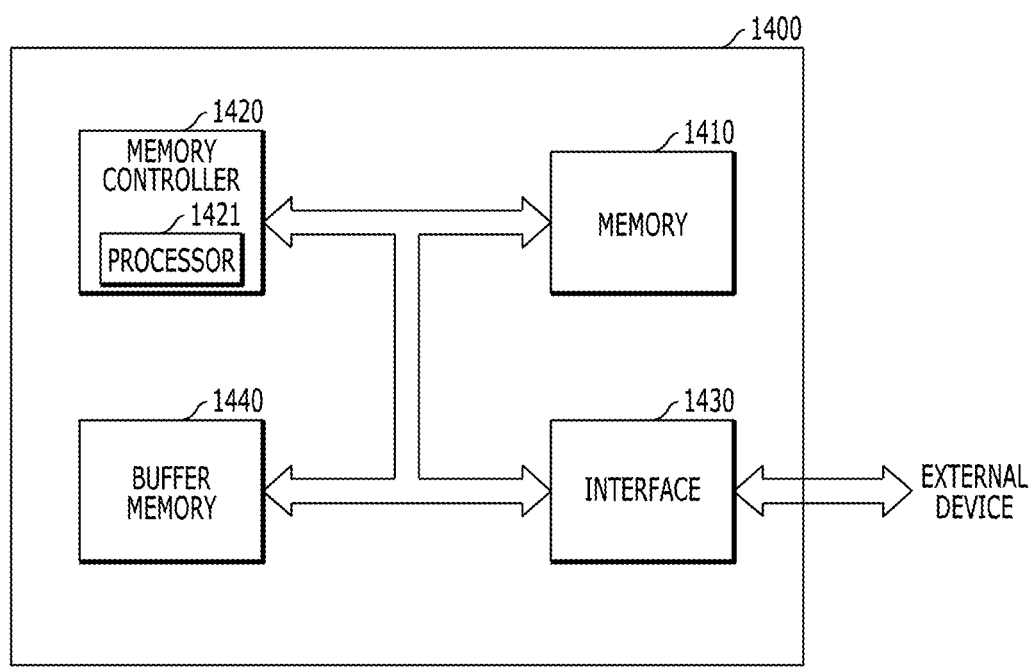
FIG. 8 is an example of a configuration diagram of a memory system implementing memory circuitry based on an implementation of the disclosed technology.

FIG. 8 is an example of a configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the memory 1410 may be improved. As a consequence, performance characteristics of the memory system 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory cell turned on based on a voltage difference between both ends; a first line coupled to one end of the memory cell; a first coupling block suitable for selectively coupling a high voltage terminal to the first line based on a first selection signal; a second line coupled to the other end of the memory cell; a second coupling block suitable for selectively coupling a first low voltage terminal to the second line based on a second selection signal; and a first charge storing circuit selectively coupled to the first line based on an enable signal corresponding to a predetermined operation mode when the memory cell is turned on. Through this, characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, initializing a resistance variable element is easy, and it is possible to secure reliable characteristics of the resistance variable element.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device including a semiconductor memory, wherein the semiconductor memory includes:
   a memory cell;
   a first line coupled to a first end of the memory cell;
   a first coupling circuit to selectively couple a high voltage terminal to the first line in response to a first selection signal;
   a second line coupled to a second end of the memory cell;
   a second coupling circuit to selectively couple a first low voltage terminal to the second line in response to a second selection signal; and
   a first charge storing circuit to store charges and supply the stored charges to the first line in response to an enable signal, the enable signal corresponding to a predetermined operation mode when the memory cell is turned on.

2. The electronic device according to claim 1, wherein the first charge storing circuit adjusts at least one of an amplitude and a pulse width of an overshoot current flowing through the first line when the memory cell is turned on.

3. The electronic device according to claim 1, wherein the first charge storing circuit includes:
   a first coupling unit to selectively couple the first line to a first node in response to the enable signal; and
   a first storing unit coupled between the first node and the second low voltage terminal.

4. The electronic device according to claim 3, wherein the first low voltage terminal and the second low voltage terminal include a same voltage terminal or different voltage terminals.

5. The electronic device according to claim 1, wherein the semiconductor memory further includes:
   a second charge storing circuit selectively coupled to the second line in response to the enable signal when the memory cell is turned on.

6. The electronic device according to claim 5, wherein the second charge storing circuit adjusts at least one of an amplitude and a pulse width of an overshoot current flowing through the second line when the memory cell is turned on.

7. The electronic device according to claim 5, wherein the second charge storing circuit includes:
   a second coupling unit to selectively couple the second line to a second node in response to the enable signal; and
   a second storing unit coupled between the second node and a second low voltage terminal.

8. The electronic device according to claim 1, wherein the memory cell includes a variable resistance element and a selection element that are coupled in series to each other, a resistance state of the variable resistance element varying based on a current flowing through the memory cell, the selection element being turned on based on a voltage difference between the first and second ends of the memory cell.

9. The electronic device according to claim 1, wherein the predetermined operation mode includes a write mode, a resistance state of the memory cell changing to a high voltage state in the write mode.

10. The electronic device according to claim 1, wherein the predetermined operation mode includes a recovery mode, a threshold voltage of the memory cell returning to an original value in the recovery mode.

11. An electronic device including a semiconductor memory, wherein the semiconductor memory includes:
    a global bit line;
    a plurality of local bit lines;
    a global word line;
    a plurality of local word lines;
    a write circuit coupled between a high voltage terminal and an output terminal, the write circuit being outputting an operation current corresponding to any one of a plurality of operation modes to the output terminal based on a plurality of enable signals, the plurality of enable signals corresponding to the plurality of operation modes;
    a first global coupling circuit to selectively couple the output terminal to the global bit line in response to a first global selection signal;
    a first local coupling circuit to selectively couple one bit line selected from the local bit lines to the global bit line based on a plurality of first local selection signals;
    a plurality of memory cells disposed in respective intersection regions between the local bit lines and the local word lines and coupled between the local bit lines and the local word lines, each of the memory cells having a resistance state corresponding to the operation current;

a second local coupling circuit to selectively couple one word line selected from the local word lines to the global word line based on a plurality of second local selection signals;

a second global coupling circuit to selectively couple the global word line to a low voltage terminal in response to a second global selection signal;

a control circuit to generate a control enable signal based on two or more enable signals selected from the plurality of enable signals; and a first charge storing circuit selectively coupled to the global bit line in response to the control enable signal when a memory cell selected from the memory cells is turned on.

12. The electronic device according to claim 11, wherein the first charge storing circuit adjusts at least one of an amplitude and a pulse width of an overshoot current flowing through the global bit line when the selected memory cell is turned on.

13. The electronic device according to claim 11, wherein the low voltage terminal is a first low voltage terminal, and wherein the first charge storing circuit includes:

a first coupling unit to selectively couple the global bit line to a first node in response to the control enable signal; and a first storing unit coupled between the first node and a second low voltage terminal.

14. The electronic device according to claim 13, wherein the first low voltage terminal and the second low voltage terminal include a same voltage terminal or different voltage terminals.

15. The electronic device according to claim 11, wherein the semiconductor memory further includes:

a second charge storing circuit selectively coupled to the global word line in response to the control enable signal when the selected memory cell is turned on.

16. The electronic device according to claim 15, wherein the second charge storing circuit adjusts at least one of an amplitude and a pulse width of an overshoot current flowing through the global word line when the selected memory cell is turned on.

17. The electronic device according to claim 15, wherein the low voltage terminal is a first low voltage terminal, and wherein the second charge storing circuit includes:

a second coupling unit to selectively couple the global word line to a second node in response to the control enable signal; and a second storing unit coupled between the second node and a second low voltage terminal.

18. The electronic device according to claim 11, wherein each of the memory cells includes a variable resistance element and a selection element that are coupled in series to each other, a resistance state of the variable resistance element varying based on the operation current, the selection element being turned on based on a voltage difference between both ends of each of the memory cells.

19. The electronic device according to claim 11, wherein the plurality of operation modes include a write mode, a resistance state of the selected memory cell being changed to a high resistance state in the write mode.

20. The electronic device according to claim 11, wherein the plurality of operation modes includes a recovery mode, a threshold voltage of the selected memory cell returning to an original value in the recovery mode.

* * * * *